(12) United States Patent
Tan et al.

(10) Patent No.: US 7,893,712 B1
(45) Date of Patent: Feb. 22, 2011

(54) INTEGRATED CIRCUIT WITH A SELECTABLE INTERCONNECT CIRCUIT FOR LOW POWER OR HIGH PERFORMANCE OPERATION

(75) Inventors: Chin Hua Tan, Sembawang (SG);
Shankar Lakka, San Jose, CA (US);
Ronald L. Cline, Tijeras, NM (US);
James B. Anderson, Lubbock, TX (US);
Wayne E. Wennekamp, Rio Rancho, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/556,959

(22) Filed: Sep. 10, 2009

(51) Int. Cl.
*H03K 19/173* (2006.01)
(52) U.S. Cl. .......................... 326/41; 326/47; 326/113
(58) Field of Classification Search ............. 326/37–41, 326/47, 113
See application file for complete search history.

(56) References Cited

U.S. PATENT DOCUMENTS

| | | | |
|---|---|---|---|
| 4,204,131 A * | 5/1980 | Dozier | ....................... 327/408 |
| 4,698,760 A | 10/1987 | Lembach et al. | |
| 5,448,198 A | 9/1995 | Toyoshima et al. | |
| 5,461,338 A | 10/1995 | Hirayama et al. | |
| 5,487,033 A | 1/1996 | Keeney et al. | |
| 5,504,440 A | 4/1996 | Sasaki | |
| 5,612,636 A | 3/1997 | Ko | |
| 5,654,898 A | 8/1997 | Roetcisoender et al. | |
| 5,661,685 A | 8/1997 | Lee et al. | |
| 5,703,522 A | 12/1997 | Arimoto et al. | |
| 5,787,011 A | 7/1998 | Ko | |
| 5,808,479 A | 9/1998 | Sasaki et al. | |
| 5,811,985 A | 9/1998 | Trimberger et al. | |
| 5,815,004 A | 9/1998 | Trimberger et al. | |
| 5,825,707 A | 10/1998 | Nozawa et al. | |
| 5,880,598 A | 3/1999 | Duong | |
| 5,880,620 A | 3/1999 | Gitlin et al. | |
| 5,880,967 A | 3/1999 | Jyu et al. | |
| 5,892,961 A | 4/1999 | Trimberger | |
| 5,914,616 A | 6/1999 | Young et al. | |
| 5,929,695 A | 7/1999 | Chan et al. | |

(Continued)

FOREIGN PATENT DOCUMENTS

JP 11-122047 4/1999

(Continued)

OTHER PUBLICATIONS

Betz, Vaughn et al., "FPGA Routing Architecture: Segmentation and Buffering to Optimize Speed and Density" *Proc. of the 1999 ACM/SIGDA Seventh International Symposium on Field Programmable Gate Arrays*, Feb. 21, 1999, pp. 59-68, ACM, New York, New York, USA.

(Continued)

*Primary Examiner*—James Cho
(74) *Attorney, Agent, or Firm*—Scott Hewett; Lois D. Cartier

(57) ABSTRACT

An integrated circuit, such as a field programmable gate array or other configurable logic device, has an interconnect circuit selectively configurable to operate in a high-speed mode or in a low-power mode. The interconnect circuit is operable from a higher voltage supply or a lower voltage supply to change operating modes without reconfiguring data paths.

20 Claims, 5 Drawing Sheets

U.S. PATENT DOCUMENTS

| | | | |
|---|---|---|---|
| 5,984,510 | A | 11/1999 | Guruswamy et al. |
| 6,055,655 | A | 4/2000 | Momohara |
| 6,097,113 | A | 8/2000 | Teraoka et al. |
| 6,163,168 | A | 12/2000 | Nguyen et al. |
| 6,178,542 | B1 | 1/2001 | Dave |
| 6,269,458 | B1 | 7/2001 | Jeter et al. |
| 6,272,668 | B1 | 8/2001 | Teene |
| 6,348,813 | B1 | 2/2002 | Agrawal et al. |
| 6,362,649 | B1 | 3/2002 | McGowan |
| 6,369,630 | B1 | 4/2002 | Rockett |
| 6,380,764 | B1 | 4/2002 | Katoh et al. |
| 6,448,808 | B2 | 9/2002 | Young et al. |
| 6,486,712 | B1 * | 11/2002 | Landry et al. ............... 327/99 |
| 6,505,322 | B2 | 1/2003 | Yamashita et al. |
| 6,539,536 | B1 | 3/2003 | Singh et al. |
| 6,583,645 | B1 | 6/2003 | Bennett et al. |
| 6,590,419 | B1 | 7/2003 | Betz et al. |
| 6,604,228 | B1 | 8/2003 | Patel et al. |
| 6,621,325 | B2 | 9/2003 | Hart et al. |
| 6,630,838 | B1 | 10/2003 | Wong |
| 6,721,924 | B2 | 4/2004 | Patra et al. |
| 6,768,335 | B1 | 7/2004 | Young et al. |
| 6,774,705 | B2 | 8/2004 | Miyazaki et al. |
| 6,777,978 | B2 | 8/2004 | Hart et al. |
| 6,930,510 | B2 | 8/2005 | New |
| 6,949,951 | B1 * | 9/2005 | Young et al. ............... 326/37 |
| 6,950,998 | B1 | 9/2005 | Tuan |
| 6,960,934 | B2 | 11/2005 | New |
| 7,089,527 | B2 | 8/2006 | Hart et al. |
| 7,138,828 | B2 | 11/2006 | New |
| 7,225,423 | B2 | 5/2007 | Bhattacharya et al. |

FOREIGN PATENT DOCUMENTS

| | | |
|---|---|---|
| JP | 11-195976 | 7/1999 |
| JP | 2001-015603 | 1/2001 |
| JP | 2001-203325 | 7/2001 |
| JP | 2002-538634 | 11/2002 |
| WO | WO 00/52826 A | 9/2000 |
| WO | WO 01/28097 A | 4/2001 |

OTHER PUBLICATIONS

Dobbelaere, Ivo et al., "Regenerative Feedback Repeaters for Programmable Interconnections" *IEEE Journal of Solid-State Circuits*, Nov. 1, 1995, pp. 1246-1253, vol. 30, No. 11, IEEE, Piscataway, New Jersey, USA.

Hutton, Michael et al., "Interconnect Enhancements for a High-Speed PLD Architecture," *Proc. of the 2002 ACM/SIGDA Tenth International Symposium on Field-Programmable Gate Arrays*, Feb. 24, 2002, pp. 3-10, ACM, New York, New York, USA.

Kuroda, T. et al., "A 0.9 V 150 MHz 10 mW 4 mm$^2$-D Discrete Cosine Transform Core Processor with Variable-Threshold-Voltage Scheme," *Digest of Technical Papers—1996 IEEE International 42$^{nd}$ Solid-State Circuits Conference*, Feb. 8, 1996, pp. 166-167, 437, IEEE, Piscataway, New Jersey, USA.

Kuroda, T. et al., "A High-Speed Low-Power 0.3/μm CMOS Gate Array with Variable Threshold Voltage (VT) Scheme," *Proc. of the 1996 IEEE Custom Integrated Circuits Conference*, May 5, 1996, pp. 53-56, IEEE, Piscataway, New Jersey, USA.

Nose, Koichi et al., "$V_{TH}$-hopping Scheme for 82% Power Saving in Low-Voltage Processors," *Proc. of the 2001 IEEE Custom Integrated Circuits Conference*, May 6, 2001, pp. 93-96, IEEE, Piscataway, New Jersey, USA.

Wang, Ping-Tsung et al., "A Hierarchical Interconnection Structure for Field-Programmable Gate Arrays," *Proc. of the 1993 IEEE Region Ten Conference on Computer, Communication, Control and Power Engineering*, Oct. 19, 1993, pp. 557-560, vol. 3, IEEE, Piscataway, New Jersey, USA.

Xilinx Inc., *Virtex-II Platform FPGA Handbook*, Dec. 6, 2000, pp. 33-75, Xilinx., Inc., San Jose, California, USA.

* cited by examiner

US 7,893,712 B1

INTEGRATED CIRCUIT WITH A SELECTABLE INTERCONNECT CIRCUIT FOR LOW POWER OR HIGH PERFORMANCE OPERATION

FIELD OF THE INVENTION

This invention relates generally to integrated circuits (ICs), and more particularly to interconnect circuits in configurable logic devices.

BACKGROUND

Many ICs are made up of millions of interconnected devices, such as transistors, resistors, capacitors, and diodes, on a single chip of semiconductor substrate. CMOS circuits and fabrication technology are commonly used in complex ICs. CMOS circuits use PMOS and NMOS devices to implement functions such as logic.

Field-programmable gate arrays ("FPGAs") are a type of configurable logic device that often incorporate CMOS techniques in some functional blocks of the FPGA, such as logic blocks, and incorporate other techniques, such as NMOS techniques, in other functional blocks, such as interconnect blocks. An interconnect block is basically a matrix of user-selectable switches that connect circuits and nodes of other portions of the FPGA together, or connect circuits and nodes of FPGA to external pins. The interconnect and logic blocks allow the FPGA to be configured into a variety of circuits to perform user-specified operations. NMOS pass gates in interconnect circuits offer high-speed switching operation at the expense of relatively high leakage current (power draw), and draw significant current even in user standby mode.

Interconnect circuits that offer low standby current draw while providing sufficiently high operational switching speed are desirable.

SUMMARY

An integrated circuit, such as a field programmable gate array or other configurable logic device, has an interconnect circuit selectively configurable to operate in a high-speed mode or in a low-power mode. The interconnect circuit is operable from a higher voltage supply or a lower voltage supply to change operating modes without reconfiguring data paths.

DETAILED DESCRIPTION

The present invention is applicable to a variety of integrated circuits (ICs). An appreciation of the present invention is presented by way of specific examples utilizing configurable ICs such as field programmable gate arrays (FPGAs). However, the present invention is not limited by these examples, and can be applied to any appropriate IC that includes configurable interconnect circuits.

Figure 1:
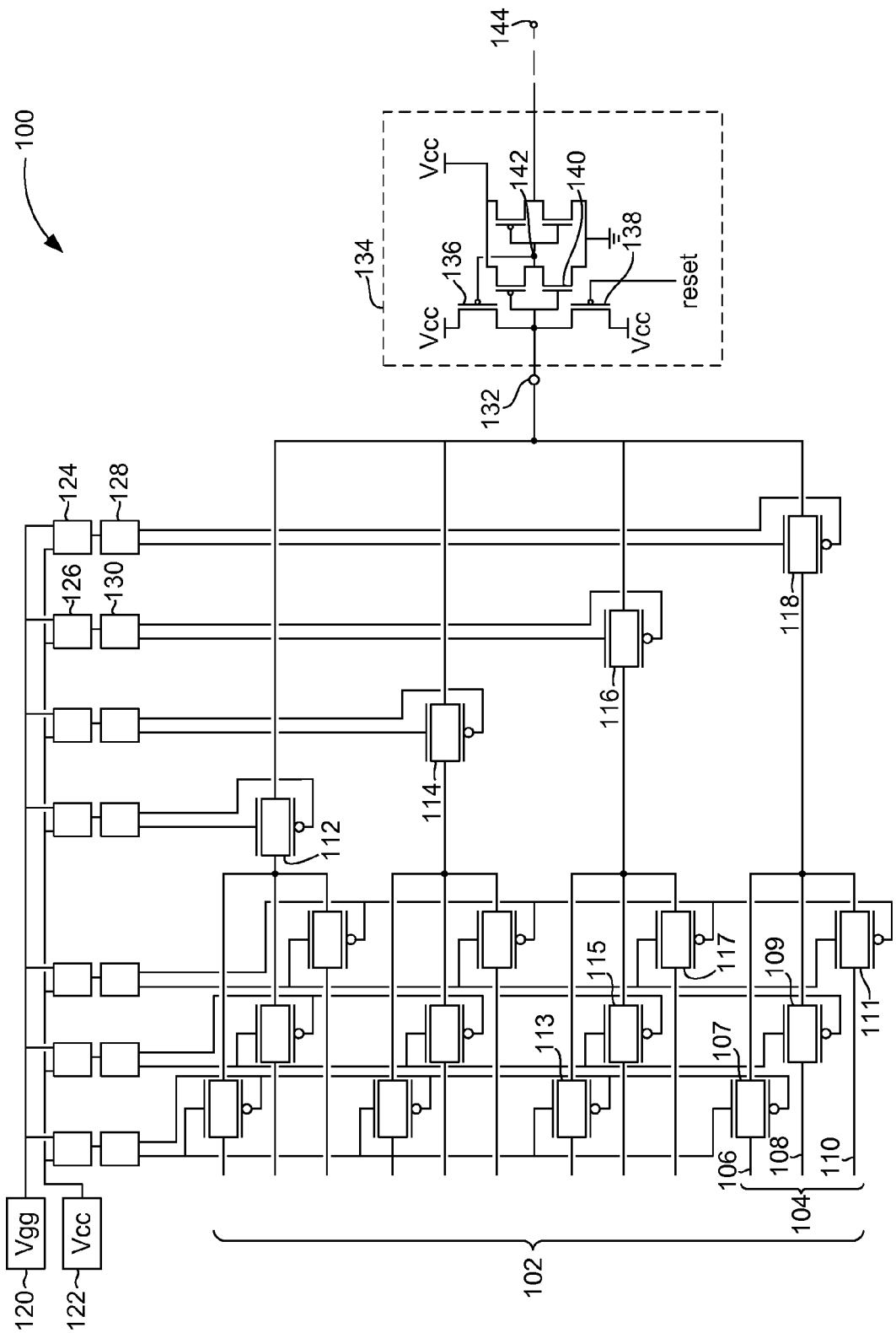
FIG. 1 is a circuit diagram of a portion of an interconnect circuit in an FPGA according to an embodiment.

FIG. 1 is a circuit diagram of a portion of an interconnect circuit in an FPGA 100 according to an embodiment. The illustrated interconnect circuit is commonly known as a 12-by-one multiplexer ("12×1 MUX"). Alternative embodiments use multiplexers of other sizes. The inputs 102 are arranged in groups of three (e.g., group 104). Each input 106, 108, 110 is connected to an associated CMOS pass gate 107, 109, 111. Each CMOS pass gate includes an NMOS device and a PMOS device connected in parallel. The NMOS device can pass a low-voltage value (e.g., a digital zero) cleanly, and the PMOS device can pass a high-voltage value (e.g., a digital one) cleanly, i.e., without the threshold voltage (Vt) drop typically associated with passing a high-voltage value through an NMOS pass gate.

In a conventional NMOS interconnect circuit, a high-value input applied to the input is diminished by the Vt drop through the NMOS pass gate. Unfortunately, lowering the Vt generally also increases the leakage current through the NMOS pass gate, even when the NMOS pass gate is not active. Leakage current not only consumes power, it can also cause voltages at other nodes in the interconnect circuit or in the FPGA to rise, or fall if there is too much IR drop. Although increasing the Vt of an NMOS pass gate would reduce leakage current, it would also slow operation of the interconnect circuit and further degrade the voltage level of a high-value data bit passed through the NMOS pass gate.

In a particular embodiment, all of the CMOS pass gates, which include the first tier CMOS pass gates 107, 109, 111, 113, 115, 117 and the second tier CMOS pass gates 112, 114, 116, 118, are high threshold voltage CMOS pairs. Several techniques are known in the art of CMOS fabrication for increasing the threshold voltage of a field-effect transistor or of a CMOS pair, such as by adjusting the doping concentration of the transistor during manufacturing or other technique. In a particular embodiment, CMOS pairs in a logic block of an FPGA (see FIG. 6, ref. num. 612) have a first design threshold voltage, and CMOS pairs in an interconnect block of the FPGA (see FIG. 6, ref. num. 611) have a second design threshold voltage greater than the first design threshold voltage. In a more particular embodiment, the FPGA is designed according to a 90 nm node technology, the first design threshold voltage is about 350 mV, and the second design threshold voltage is about 430 mV or greater. Increasing the threshold voltage by 80 mV decreases the leakage current through the FET by about a decade (i.e., to about one tenth of the leakage current at the lower Vt).

NMOS pass gates having higher threshold voltages generally require higher drive voltages to obtain a given operating speed. Similarly, for a fixed threshold voltage, increasing the NMOS gate drive voltage generally increases operating speed at which a data value will be transmitted from an input to the output. An FPGA according to a particular embodiment has two positive on-chip voltage supplies, Vcc, which is the positive voltage supply used for most of the FPGA circuit operation, and Vgg, which is higher than Vcc and is used for programming configuration memory and other critical circuit operations. In a typical conventional FPGA, memory cells associated with interconnect circuits are all driven by Vgg. In particular embodiments, memory cells associated with high-performance portions of CMOS interconnect circuits are selectively switchable to operate off of Vcc or Vgg. Hooking up all memory to Vgg is not desirable, due to the increased stand-by power draw and the increased demands it would create on the Vgg supply.

In a particular embodiment, Vgg is generated from Vcc-aux, which is an external voltage that is higher than Vcc. Vgg is regulated to insure proper operation of the FPGA at the process, voltage, and temperature ("PVT") extremes of the FPGA. For example, Vgg is regulated to ensure that the FPGA is operational at the lowest specified operating temperature.

In prior FPGAs using NMOS pass gates, the NMOS pass gates in interconnect circuits were controlled by Vgg, which provided high-speed operation and good data fidelity. However, the voltage regulation circuit for Vgg consumes a relatively large amount of power, even when the FPGA, or the portion of the FPGA utilizing the NMOS interconnect, is in standby mode.

In the interconnect circuit of FIG. 1, the CMOS pass gates are operable off of the Vgg supply terminal 120 (for high-performance operation) or off of the Vcc supply terminal 122 (for low-power operation). In a particular embodiment, the interconnect circuit operates off of the Vgg supply when the FPGA is utilizing the interconnect circuit in an operation, and off of the Vcc supply when the FPGA or the relevant portion of the FPGA is in a standby mode. The interconnect circuit may be toggled between low-power operation and high-speed operation without re-routing the connecting paths. The power supplies are selected by switches 124, 126 connected to memory cells 128, 130. The switches 124, 126 can by controlled by a signal supplied external to the FPGA, by a memory cell in the FPGA that can be set during operation (e.g., by partial reconfiguration), or by a signal supplied from other logic within the FPGA, for example. The memory cells 128, 130 provide the gate bias voltage (i.e., either Vcc or Vgg) to the CMOS pairs 118, 116. Address and data lines that are used to write to the memory cell(s) during configuration, partial reconfiguration, or refresh are omitted for clarity of illustration, as they are well known in the art of memory cell arrays. The other switches and memory cells in the multiplexer circuit operate similarly with the associated CMOS pairs. In one embodiment, all of the CMOS pairs are fabricated so that the NMOS FETs and the PMOS FETs are high Vt devices.

The first tier of CMOS pairs function as four 3-to-1 multiplexers, and the second tier of CMOS pairs 112, 114, 116, 118 function as a 4-to-1 multiplexer that operates in conjunction with the first tier to provide a 12-to-1 multiplexer function. The multiplexer output node 132 of the 12-to-1 multiplexer circuit is coupled to an output bit circuit 134 that operates as an inverter/latch. The PMOS FET 136 is a weak pull-up transistor that operates as a weak latch and PMOS FET 138 resets the output node 132 when a reset signal turns on FET 138, connecting the multiplexer output node 132 to Vcc and initializing node 132. In low-power operation according to a particular embodiment, the PMOS FET 136, which in a particular embodiment is designed to be a high Vt transistor, is OFF, reducing current through FET 136 to ground through NMOS FET 140. In high-speed operation, FET 136 follows internal node 142 to supply current to multiplexer output node 132. The output bit is asserted at interconnect output node 144. It is desirable to operate high Vt transistors off of the higher voltage supply (e.g., Vgg) at low temperatures, since threshold voltage increases with decreasing temperature.

Figure 2:
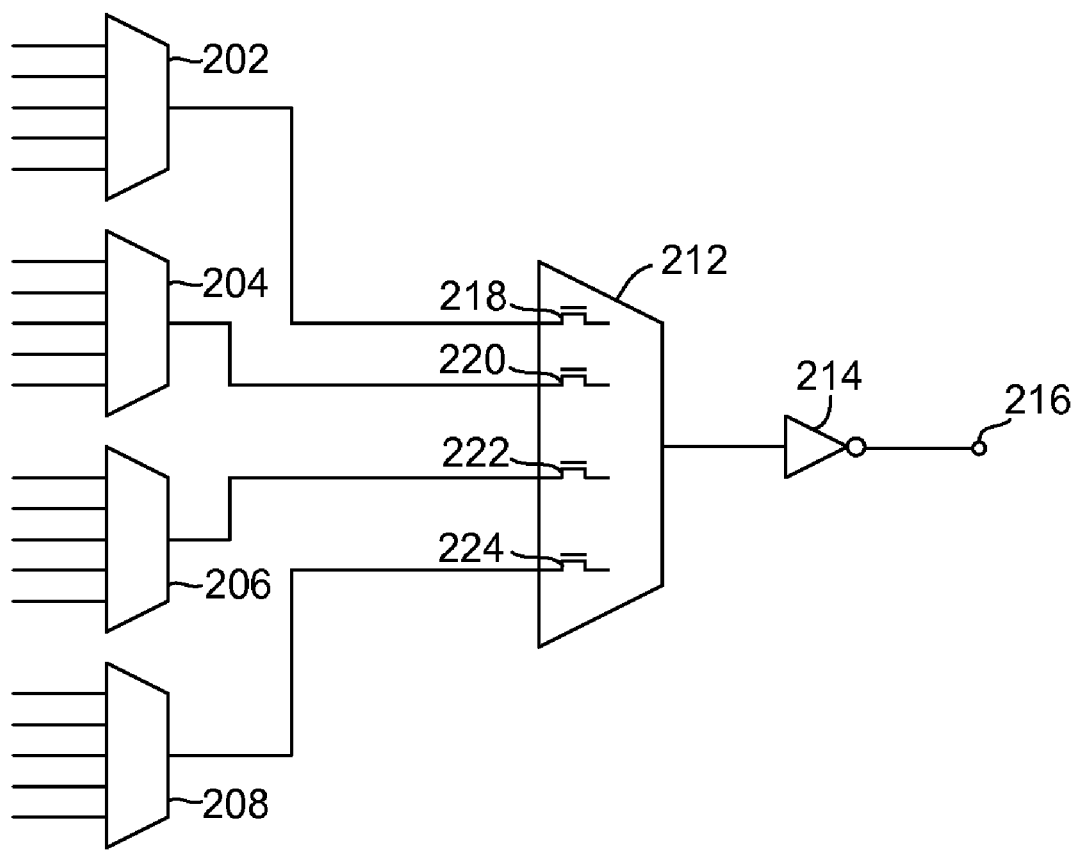
FIG. 2 is a circuit diagram of a portion of an interconnect circuit in an IC according to another embodiment.

FIG. 2 is a circuit diagram of a portion of an interconnect circuit 200 in an IC according to another embodiment. The portion of the interconnect circuit is a twenty-by-one multiplexer that routes four five-by-one multiplexers 202, 204, 206, 208 into a four-by-one multiplexer 212 that drives an output bit 214, which in this example is an inverter (see, FIG. 1, ref. num. 134). The output bit uses low-Vt NMOS FETs to pull down the output 216 and higher (regular)-Vt PMOS FETs to pull up the output 216.

Two of the five-by-one multiplexers 202, 204 are designed and fabricated with low-Vt transistors, which provide high speed operation, and the other two five-by-one multiplexers 206, 208 are designed and fabricated with higher-Vt (e.g., regular Vt) transistors, which provide lower power consumption. The transistors can be CMOS transistors, as described in reference to FIG. 1, or NMOS pass transistors. In a particular embodiment, NMOS pass FETs in multiplexers 202, 204 of a CMOS embodiment are low-Vt transistors while the NMOS pass FETs in multiplexers 206, 208 are regular (higher) Vt transistors. In a further embodiment, the PMOS pass FETs in multiplexers 202, 204 are also low-Vt transistors. In one embodiment, the low-Vt transistors are fabricated using lower doping concentration(s) in the channel region of the devices. In an alternative embodiment, the IC incorporating the hybrid interconnect circuit 200 is fabricated using a dual-oxide process. FETs in the IC can be specified as being either thin oxide (e.g., nominally 15-22 Angstroms for the gate oxide in a 90 nm node technology) or mid oxide (e.g., nominally 30 Angstroms for the gate oxide in a 90 nm node geometry). The gate electrode is more strongly coupled to the underlying channel region through the thinner gate oxide, resulting in lower Vt. In a particular embodiment, the lower Vt FETs have a Vt at least 80 mV less than the Vt of the normal, higher Vt FETs, thus the NMOS pass FETs in multiplexer 204 conduct about an order of magnitude more leakage current per micron of gate width than an equivalent NMOS FET with a standard (higher) Vt.

The multiplexer 212 has two low-Vt pass gates and two high-Vt pass gates 218, 220 and two regular, higher-Vt pass gates 222, 224. The low-Vt pass gates 218, 220 are coupled to the low-Vt multiplexers 202, 204, while the higher-Vt pass gates 222, 224 are coupled to the higher-Vt multiplexers 206, 208. In a particular embodiment, the IC in which the interconnect circuit 200 is incorporated allows user selection of either the low-Vt (high speed) multiplexer paths 202, 204 to the output 216 or the higher-Vt (low power) multiplexer paths 206, 208 to the output 216. In an alternative embodiment, all the pass gates in multiplexer 212 are low-Vt pass gates.

Selection can be fixed for a particular application, or switched from one operating condition to the other as desired. For example, an application may select (i.e., route the inputs) to the high-speed multiplexer paths when active (i.e., during data transmission), and then switch to a low power mode ("standby") after a selected timeout until data transmission resumes using a partial reconfiguration technique. In a particular embodiment, the power (bias voltage, see FIG. 1, ref. nums. 120, 122) to the non-selected multiplexers is disconnected, and is reconnected when those multiplexers are selected, which reduces power consumption. It is especially desirable to turn off the low-Vt multiplexers in standby mode, or to switch power from a higher voltage source (e.g., Vgg) to a lower voltage source (e.g., Vcc) during standby. In one embodiment, the low-Vt multiplexers are biased using Vcc. In an alternative embodiment, the low-Vt multiplexers are biased using Vgg. In a further embodiment, the bias voltage to the low-Vt multiplexers is selectable between Vcc and Vgg. In a particular embodiment, the bias voltage to the higher-Vt multiplexers 206, 208 is Vcc or in a further embodiment Vgg or switchable between Vcc and Vgg. Mixing higher Vt and lower Vt transistors in an interconnect operable off of different gate voltages makes an interconnect circuit adaptable to either low power or high performance operation for an FPGA or other interconnect architecture.

Figure 3:
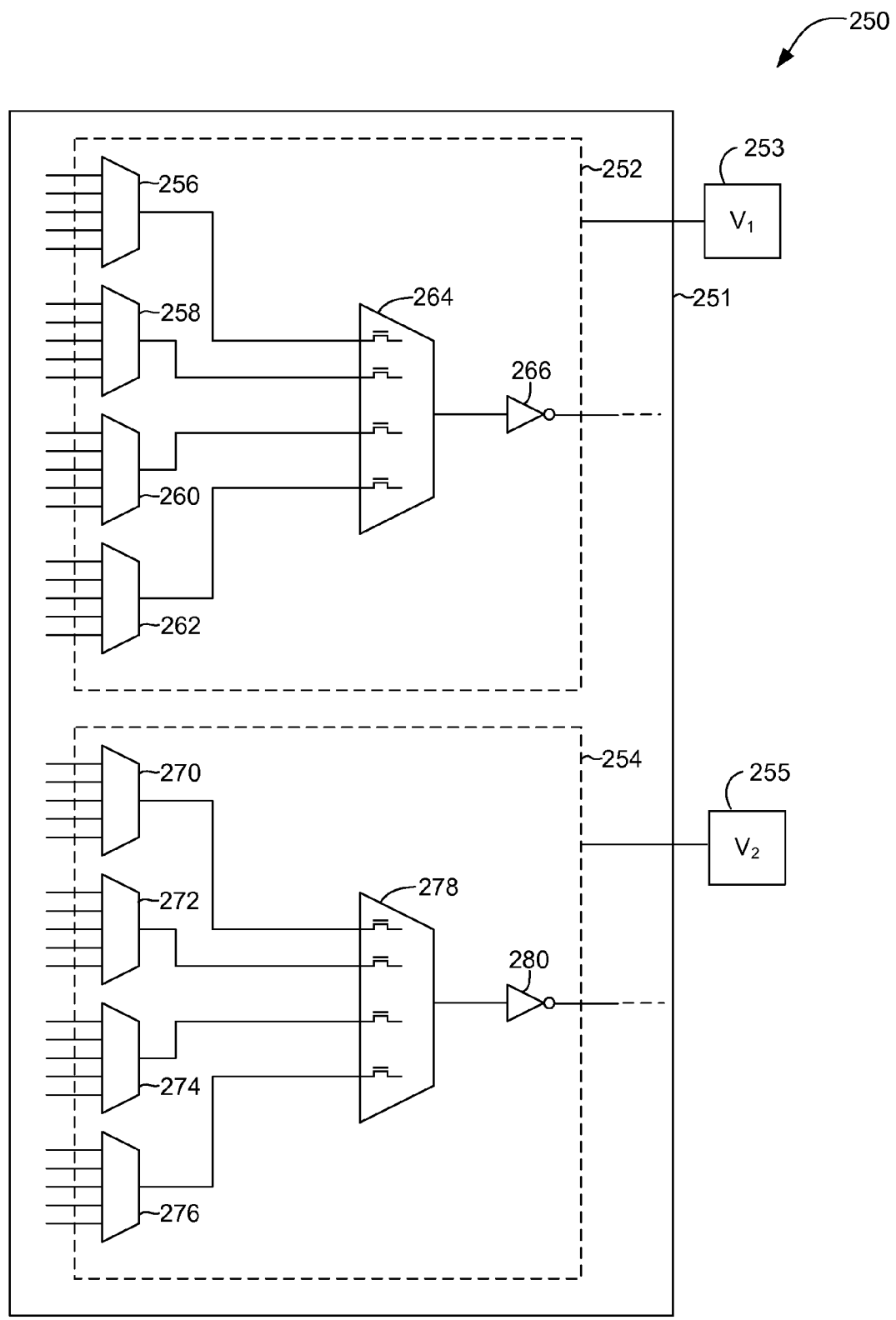
FIG. 3 is a circuit diagram of a portion of an IC with an interconnect circuit according to an alternative embodiment.

FIG. 3 is a circuit diagram of a portion of an IC 250 with an interconnect circuit 251 according to an alternative embodiment. The interconnect circuit 251 has a high-speed interconnect block 252 and a low-power interconnect block 254. The high-speed interconnect block 252 is fabricated using low-Vt transistors for at least the NMOS FETs in the signal path, as described above in reference to FIG. 1, and the low-power interconnect block 254 is fabricated using higher-Vt transistors. In a particular embodiment, the NMOS pass FETs in the five-to-one multiplexers 256, 258, 260, 262, the four-to-one multiplexer 264, and the output bit 266 are all low-Vt FETs.

In an alternative embodiment, the output bit and/or the four-to-one multiplexer uses regular (higher) Vt NMOS FETs. In a further embodiment, the PMOS FETs in the multiplexers and/or output bit are also low-Vt FETs. In a particular embodiment, the NMOS pass FETs in the low-power interconnect block 254 have a threshold voltage at least 50 mV higher than the NMOS pass FETs in the high-speed interconnect block 252 and in a particular embodiment about 80 mV higher. In a particular embodiment, the IC is an FPGA and is configured to run an application that uses the high-speed interconnect block 252 for some signal paths and concurrently uses the low-power interconnect block 254 for other signal paths. In a particular embodiment, a pull-up FET in the output bit 266 is a regular (higher) Vt FET, and a pull-down FET, which in a further embodiment is a NMOS FET, is a low Vt FET. In a further embodiment, the high-speed interconnect block 252 is driven by a first power supply 253 having a first supply voltage (V1, e.g., Vgg) greater than a second supply voltage (V2, e.g., Vcc) provided by a second power supply 255 that drives the low-power interconnect block 254.

In an alternative embodiment, both interconnect blocks are driven by the same voltage supply. In some applications, the low-power interconnect block 254 remains ON while power (i.e., voltage supply 253, or alternatively a common voltage supply) is disconnected from the high-speed interconnect block 252. Switches between the power supplies 253, 255 and interconnect blocks 252, 254 and associated control lines are omitted for clarity of illustration. Applications that configure data signal paths that remain set throughout the operation of the application are commonly called "static connections".

The multiplexers 270, 272, 274, 276 in the low-power interconnect block 254 are fabricated with MOS transistors designed to have a higher threshold voltage than the MOS transistors used in the high-speed interconnect block 252, as are the MOS transistors in the four-to-one multiplexer 278 and in the output bit 280. In a further embodiment, the output bit 280 includes a low-Vt pull down FET and a pull-up FET with a regular (i.e., higher) Vt.

In an alternative embodiment, the FPGA is configured to run an application that uses the high-speed interconnect block 252 for selected signal paths during one portion of operation, and uses the low-power interconnect block 254 (i.e., the FPGA is partially reconfigured during the application) for the selected signal paths during another portion of operation. Such operation is commonly referred to as "dynamic connection".

In yet another embodiment, a user selects which interconnect blocks in an FPGA having both low-power and high-speed interconnect blocks are used in a user-specified application. For example, a user can define applications with interconnect blocks that are all high-speed, all low-power, a mixture of high-speed and low power, or that toggle between low-power and high-speed during operation of the application. In many cases, an FPGA has more interconnect paths available than are required for a user application. Thus, a single FPGA design (IC chip) can be used in a variety of applications. In a particular embodiment, about one-half of the interconnect blocks (i.e., interconnect pins/nodes/paths) are high-speed. In an exemplary net (application configuration), there are about one thousand data paths through interconnect blocks with about half the data paths being speed critical. If an application requires more of one type of interconnect block, for example more than half the data paths are speed critical, embodiments still obtain advantages by providing optimized interconnects (either high-speed or low-power) for a large portion of the signal paths. Hybrid interconnect circuits are also particularly desirable in ICs, including FPGAs, fabricated according to a node geometry less than 180 nm due to the increased leakage currents associated with the smaller geometries. A particular embodiment is incorporated in an FPGA fabricated according to a 90 nm node geometry.

Figure 4:
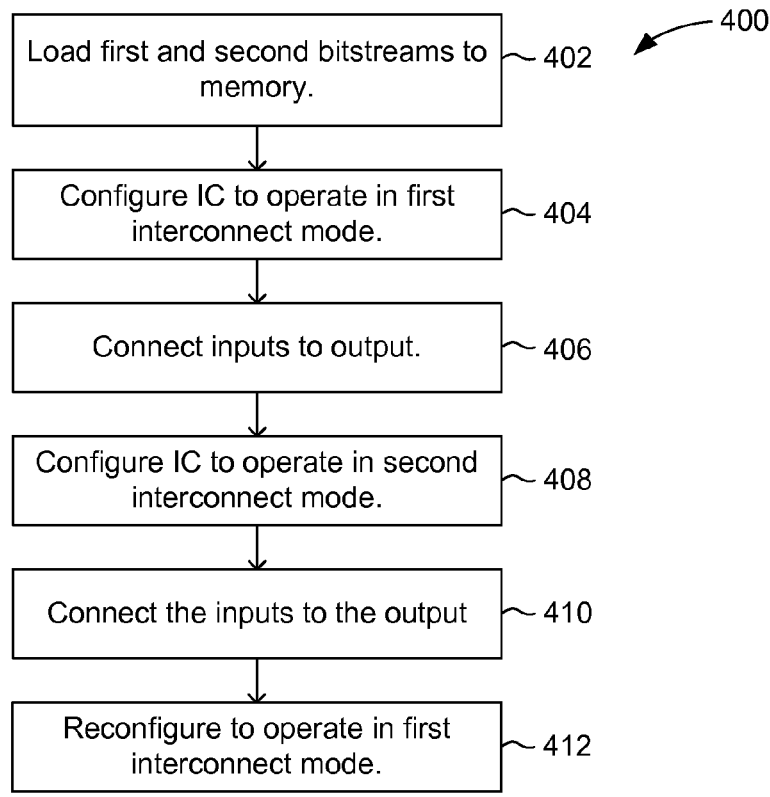
FIG. 4 is a flow chart of a method of operating an interconnect circuit in an FPGA according to an embodiment.

FIG. 4 is a flow chart of a method 400 of operating an interconnect circuit in an IC according to an embodiment. In one embodiment, the IC includes a high-speed interconnect circuit and a low-power interconnect circuit. In an alternative embodiment, the IC includes an interconnect circuit that is selectively operable in either a high-speed mode or in a low-power mode. In a particular embodiment, the IC is an FPGA. In a further embodiment, the FPGA includes non-volatile memory storing a first configuration bitstream to configure at least a portion of the FPGA (including interconnects and optionally other functional blocks) to operate in a high-speed mode and a second configuration bitstream to configure the portion of the FPGA to operate in a low power mode.

The method 400 optionally includes a step of loading (storing) the first and second bitstreams to memory of the FPGA (step 402). Alternatively, one or both bitstreams are stored in an external PROM or other external memory device and selectively loaded into the FPGA.

An interconnect circuit is configured to operate in a first mode (step 404) to connect a plurality of inputs to one or more outputs (step 406). The interconnect circuit is then configured to operate in a second mode (step 408) to connect the plurality of inputs to the one or more outputs (step 410). In a further embodiment, the interconnect circuit is re-configured to operate in the first mode (step 412).

In a particular embodiment, the first mode is a low-power mode and the second mode is a high-speed mode. In a particular embodiment, NMOS gates of the interconnect circuit are selectively connected to a first voltage supply in the first mode and are selectively connected to a second voltage supply in the second mode where the second voltage supply provides a higher voltage than the second voltage supply. In a particular embodiment, the first voltage supply is a Vcc supply and the second voltage supply is a Vgg supply.

In an alternative embodiment, the first mode is a high-speed mode and the second mode is a low-power mode. In a particular embodiment, NMOS gates of the interconnect circuit are selectively connected to a first voltage supply in the first mode and are selectively connected to a second voltage supply in the second mode where the first voltage supply provides a higher voltage than the second voltage supply. In a particular embodiment, the first voltage supply is a Vgg supply and the second voltage supply is a Vcc supply.

In a particular embodiment, the IC is an FPGA configured to operate in one mode until a condition is met, and then to switch to the second mode. For example, the FPGA operates the interconnect circuit in a high-speed mode during data transmission through the interconnect circuit, and then automatically switches to a low-power standby mode (e.g., after a selected time-out) until data transmission resumes. When data transmission resumes, the interconnect returns to the high-speed mode. Thus, the interconnect can toggle between low-power and high-speed operation without re-routing the data paths.

Figure 5:
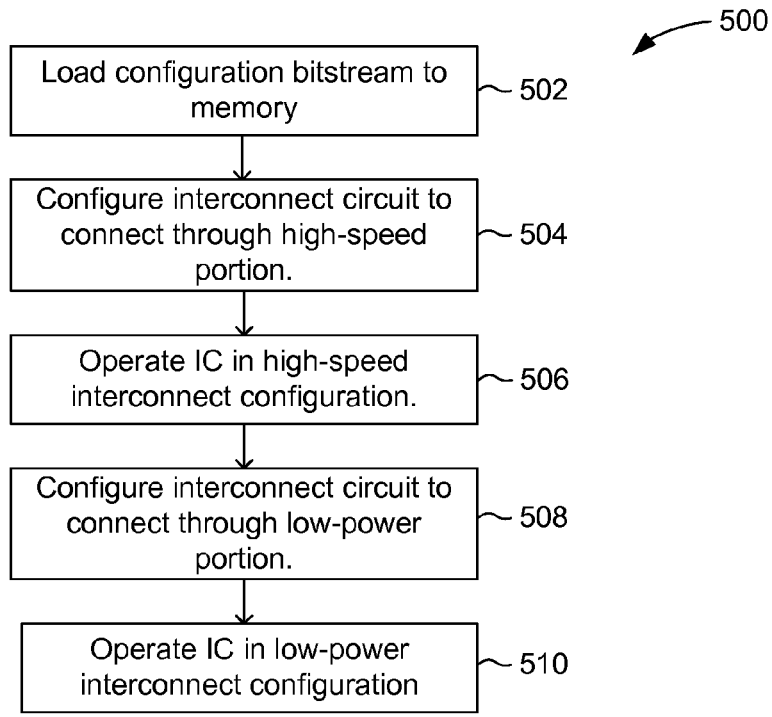
FIG. 5 is a flow chart of a method of operating an interconnect circuit in an IC according to an embodiment.

FIG. 5 is a flow chart of a method 500 of operating an interconnect circuit in an IC according to another embodiment. In one embodiment, the IC includes a high-speed interconnect circuit and a low-power interconnect circuit. In an alternative embodiment, the IC includes an interconnect circuit that is configurable to provide both a high-speed interconnect portion and a low-power interconnect portion. In a particular embodiment, the IC is an FPGA. In a further embodiment, the FPGA includes non-volatile memory storing a configuration bitstream to configure the interconnect circuit of the FPGA to operate in both a high-speed mode and a low power mode.

The method 500 optionally includes a step of loading (storing) the bitstream to memory of the FPGA (step 502). Alternatively, the bitstream is stored in an external PROM or other external memory device and loaded into the FPGA.

The interconnect circuit is configured to provide a first plurality of inputs to a first output through a high-speed portion of the interconnect circuit (step 504), and to operate the IC in a high-speed interconnect configuration (step 506). The interconnect circuit is then configured to provide a second plurality of inputs to a second output through a low-power portion of the interconnect circuit (step 508), and to operate the IC in a low-power interconnect configuration (step 510).

In particular embodiment, the high-speed portion is driven by a first gate voltage (e.g., Vgg) and the low-power portion is driven by a second gate voltage (e.g., Vcc) less than the first voltage. In another embodiment, the high-speed portion is fabricated with transistors designed to have (i.e., fabricated with) a first threshold voltage, and the low-power portion is designed to have a second threshold voltage less than the first threshold voltage. In one embodiment, the higher Vt transistors having a Vt at least 50 mV higher than the low Vt transistors, and in a more particular embodiment are designed (and fabricated) to have a Vt about 80 my higher, which reduces leakage current by a factor of ten.

In some embodiments, the high-speed and low-power portions of the interconnect circuit are CMOS circuits, in other embodiments they are NMOS circuits, and in yet others are mixed CMOS and NMOS circuits. In a further embodiment, the high-speed portion of the interconnect circuit is at least partially fabricated using low Vt transistors and is connected to a first voltage supply (e.g., Vgg) and the low-power portion of the interconnect is fabricated using higher (regular) Vt transistors and is connected to a second, lower voltage supply (e.g., Vcc). In a further embodiment, the transistors are selectively coupled to (i.e., configurable) either the higher voltage supply or the lower voltage supply, or are both coupled to the same power supply.

Figure 6:
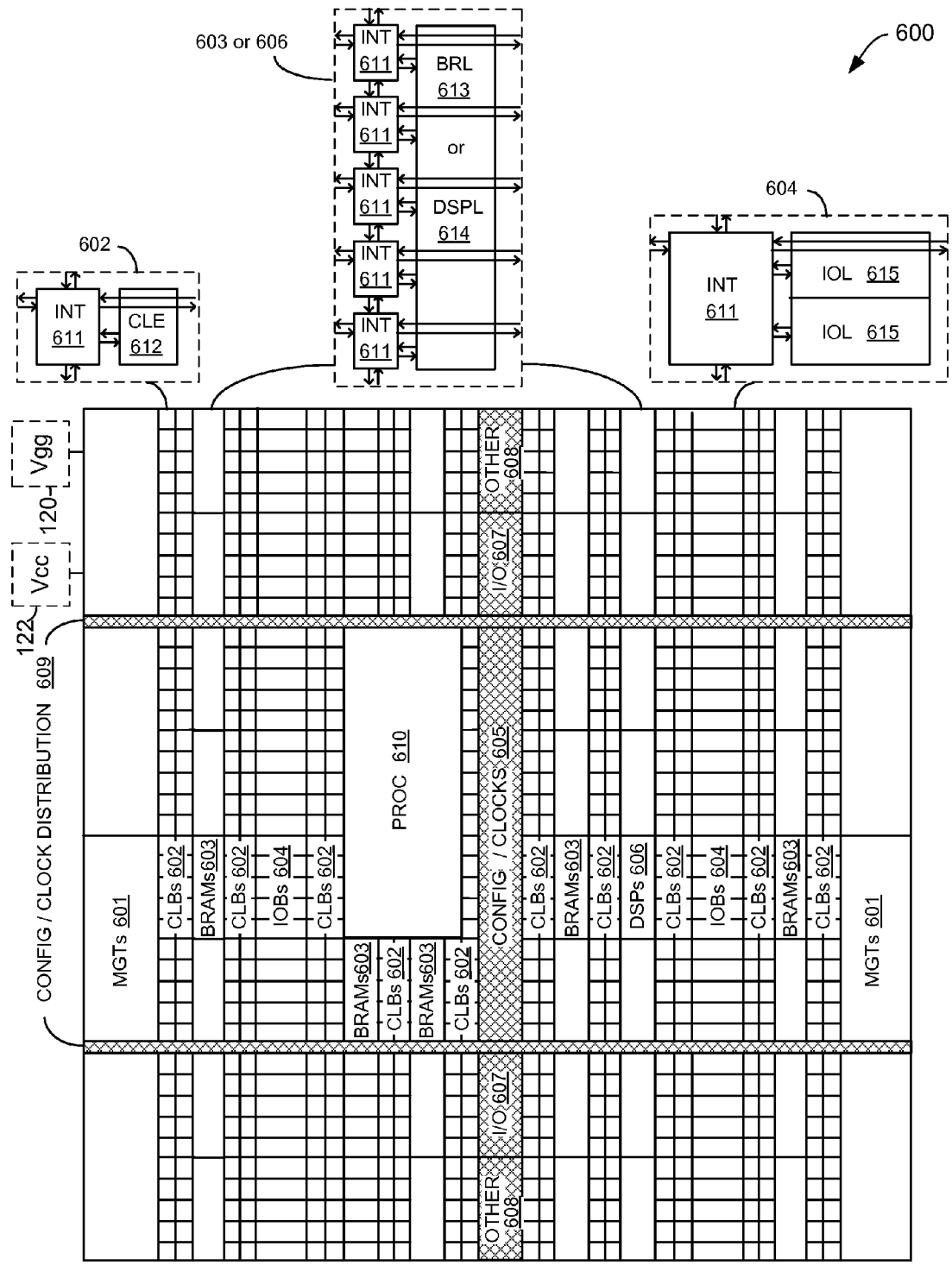
FIG. 6 is a plan view of an FPGA with CMOS interconnect blocks according to an embodiment.

FIG. 6 is a plan view of an FPGA with CMOS interconnect blocks according to an embodiment. The FPGA is fabricated using a CMOS fabrication process or mixed CMOS/NMOS process and incorporates one or more interconnect blocks buffers according to one or more embodiments of the invention. For example, interconnect block 611 can be a CMOS interconnect block having a high-speed portion fabricated using low Vt NMOS devices and a low-power portion fabricated using regular (higher) Vt NMOS devices. In an alternative embodiment, the FPGA includes an NMOS interconnect block including a high-speed portion fabricated using low Vt devices and a low-power portion using regular Vt devices. Optionally or additionally, the FPGA 600 includes a CMOS interconnect block 611 configurable to operate off of (i.e., to bias the NMOS gates with) a first voltage supply (e.g., Vcc) or a second voltage supply (e.g., Vgg) providing a higher voltage level than the first voltage supply. The voltage supplies Vcc 122 and Vgg 120 are shown in dashed lines in FIG. 6 to indicate they are not necessarily part of the FPGA chip. In a particular embodiment, the FPGA is a full CMOS FPGA, which means there are no NMOS-only interconnect circuits. In an alternative embodiment, the FPGA has some CMOS interconnect blocks and some NMOS interconnect blocks, the CMOS interconnect blocks providing low-power operation, and the NMOS interconnect blocks providing high-performance, particularly when fabricated with low Vt NMOS transistors. In some embodiments, entire CLBs (e.g., including both interconnect blocks and logic elements) are fabricated with either CMOS or NMOS. An FPGA with both types of CLBs gives the user the flexibility for low power partitions and high performance partitions.

The FPGA architecture of FIG. 6 includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An 10B 604 can include, for example, two instances of an input/output logic element (IOL 615) in addition to one instance of the programmable interconnect element (INT 611). As will be clear to those of skill in the art, the actual I/O pads connected, for example, to the IOBs 604 are manufactured using metal layers above the various illustrated logic blocks, and typically are not confined to the area of the IOBs 604. In the pictured embodiment, a columnar area near the center of the die is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative layouts of unit cells, array cores, logic gates, and control devices and circuits could be alternatively used. Therefore, the spirit and scope of the appended claims should not be limited to the foregoing description.

What is claimed is:

1. An integrated circuit ("IC"), comprising:
a first voltage supply terminal providing a first voltage;
a second voltage supply terminal providing a second voltage greater than the first voltage; and
an interconnect circuit having
a plurality of inputs, and
a plurality of pass gates corresponding to the plurality of inputs, each of the plurality of pass gates having at least an NMOS device connected to each of the plurality of inputs, gate terminals of NMOS devices in the plurality of pass gates being selectively connectable to either of the first voltage supply terminal or the second voltage supply terminal,
wherein the gate terminals of the NMOS devices are selectively connectable to the first voltage supply terminal so as to operate the interconnect circuit in a low-power mode and are selectively connectable to the second voltage supply terminal so as to operate the interconnect circuit in a high-speed mode.

2. The IC of claim 1, further comprising a plurality of user-controlled switches selectively connecting the first voltage supply terminal or the second voltage supply terminal to the gate terminals of the NMOS devices.

3. The IC of claim 1, wherein the plurality of inputs and plurality of pass gates form a portion of a multiplexer circuit in the IC.

4. The IC of claim 1, wherein the NMOS devices in the plurality of pass gates are high-threshold NMOS devices.

5. The IC of claim 4, wherein the NMOS devices have a design threshold voltage greater than 350 mV.

6. The IC of claim 1, wherein the plurality of pass gates are CMOS pass gates, each of the plurality of CMOS pass gates including a PMOS device connected in parallel with a corresponding NMOS device.

7. The IC of claim 6, wherein the NMOS devices have a design threshold voltage greater than 350 mV.

8. The IC of claim 1, wherein the IC is a field-programmable gate array, the first voltage is a Vcc voltage of the field-programmable gate array and the second voltage is a Vgg voltage of the field-programmable gate array.

9. The IC of claim 1, further comprising an output bit circuit disposed between a multiplexer node and an interconnect output node, the output bit circuit including a pull-up MOS transistor having a first threshold voltage and a pull-down transistor having a second threshold voltage less than the first threshold voltage.

10. The IC of claim 9, wherein the output bit circuit further includes a PMOS latch transistor having a gate connected to an internal node of the output bit circuit connected between a power supply and the multiplexer node.

11. The IC of claim 1, wherein the second voltage is at least 50 mV greater than the first voltage.

12. The IC of claim 1, wherein the first voltage and the second voltage are both positive voltages.

13. A method of operating an IC, comprising:
configuring an interconnect circuit in the IC to connect a plurality of inputs of the interconnect circuit to an output of the interconnect circuit, the interconnect circuit having a plurality of pass gates corresponding to the plurality of inputs, each of the plurality of pass gates having at least an NMOS device between an input and the output;
connecting gate terminals of the NMOS devices in the plurality of pass gates to a first voltage supply terminal of the IC providing a first voltage to operate the interconnect circuit in a low-power mode; and
connecting the gate terminals of the NMOS devices in the plurality of pass gates to a second voltage supply terminal of the IC providing a second voltage to operate the interconnect circuit in a high-speed mode.

14. The method of claim 13, wherein the interconnect circuit forms at least a portion of a multiplexer circuit, the interconnect circuit switching from low-power mode to high-speed mode without reconfiguring the multiplexer circuit.

15. The method of claim 13, wherein the IC is a field-programmable gate array configured to operate the interconnect circuit in the low power mode until a first condition is met, and then to switch to the high-speed mode until a second condition is met, and then to switch to the low power mode.

16. The method of claim 13, wherein the IC is a field-programmable gate array having a Vgg supply terminal and a Vcc supply terminal, the gate terminals of the NMOS devices being connected to the Vcc supply terminal during low power operation, and the gate terminals of the NMOS devices being connected to the Vgg supply terminal during high-speed operation.

17. The method of claim 13, wherein the second voltage is at least 50 mV greater than the first voltage.

18. The method of claim 13, wherein the first voltage and the second voltage are both positive voltages, the second voltage being more positive than the first voltage.

19. A method of operating an IC, comprising:
configuring the IC to couple a plurality of data signals through a corresponding plurality of inputs of an interconnect circuit in the IC operating at a first interconnect speed and a first power consumption level to an output of the interconnect circuit, and then
operating the interconnect circuit to couple the plurality of data signals through the corresponding plurality of inputs of the interconnect circuit at a second interconnect speed faster than the first interconnect speed and at a second power consumption level greater than the first power consumption level.

20. The method of claim 19, wherein the interconnect circuit is coupled to a first voltage supply terminal supplying a first voltage to operate at the first interconnect speed and the first power level, and is coupled to a second voltage supply terminal supplying a second voltage to operate at the second interconnect speed and the second power level, the second voltage being at least 50 mV greater than the first voltage.

* * * * *